US007866028B2

(12) United States Patent
Hiroshima et al.

(10) Patent No.: US 7,866,028 B2
(45) Date of Patent: Jan. 11, 2011

(54) METHOD FOR MANUFACTURING RESONANT ELEMENT

(75) Inventors: Motoharu Hiroshima, Nomi (JP); Soichi Nakamura, Omihachiman (JP); Yasunori Takei, Komatsu (JP); Hirotsugu Mori, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/431,129

(22) Filed: Apr. 28, 2009

(65) Prior Publication Data

US 2009/0206957 A1 Aug. 20, 2009

Related U.S. Application Data

(63) Continuation of application No. PCT/JP2008/057079, filed on Apr. 10, 2008.

(30) Foreign Application Priority Data

Apr. 27, 2007 (JP) ............................ 2007-118755

(51) Int. Cl.
*H01P 11/00* (2006.01)
*H01L 35/00* (2006.01)

(52) U.S. Cl. ............................ 29/600; 29/831; 29/832; 29/846; 29/849; 343/700 R

(58) Field of Classification Search .................. 29/849, 29/25.42, 846, 600, 746, 830, 831, 832; 333/185, 333/189, 178, 202, 204, 205, 203; 343/700 MS, 343/700 R, 743, 746, 750; 361/303, 306, 361/312, 321, 184, 185
See application file for complete search history.

(56) References Cited

U.S. PATENT DOCUMENTS

| | | | | |
|---|---|---|---|---|
| 5,644,275 | A * | 7/1997 | Ishizaki et al. | 333/204 |
| 5,654,681 | A * | 8/1997 | Ishizaki et al. | 333/204 |
| 6,115,234 | A * | 9/2000 | Ishii et al. | 361/303 |
| 6,612,190 | B2 * | 9/2003 | Takeuchi et al. | 73/865 |
| 2004/0066256 | A1 | 4/2004 | Maekawa et al. | |
| 2006/0038638 | A1 | 2/2006 | Shinabe | |

FOREIGN PATENT DOCUMENTS

| | | | |
|---|---|---|---|
| JP | 59-191902 | A | 10/1984 |
| JP | 10-190311 | A | 7/1998 |
| JP | 2000-022404 | A | 1/2000 |
| JP | 2004-147300 | A | 5/2004 |
| JP | 2006-087073 | A | 3/2006 |
| WO | 2008/041398 | A1 | 4/2008 |

OTHER PUBLICATIONS

Official Communication issued in International Patent Application No. PCT/JP2008/057079, mailed on Jun. 3, 2008.

* cited by examiner

*Primary Examiner*—Derris H Banks
*Assistant Examiner*—Tai Nguyen
(74) *Attorney, Agent, or Firm*—Keating & Bennett, LLP

(57) ABSTRACT

A resonant element is manufactured through a process including a setting step and a forming step. A substrate of the resonant element is made of a dielectric material. A ground electrode is formed on a rear principal surface side of the substrate. Principal-surface electrodes that define resonators together with the ground electrode and the dielectric material are formed on a front principal surface side of the substrate. An electrode protecting layer is formed on substantially entire surfaces on a front principal surface side of the principal-surface electrodes and the substrate. A coupling adjusting electrode with both ends facing a plurality of the principal-surface electrodes is formed on a front principal surface side of the electrode protecting layer. In the setting step, the shape of the coupling adjusting electrode is set in each manufactured lot. In the forming step, the coupling adjusting electrode having the shape set in the setting step in each manufactured lot is formed on the front principal surface side of the substrate and the electrode protecting layer that are sintered in advance, and the coupling adjusting electrode is baked to the electrode protecting layer.

5 Claims, 4 Drawing Sheets

METHOD FOR MANUFACTURING RESONANT ELEMENT

BACKGROUND OF THE INVENTION

1. Field of the Invention

The present invention relates to a resonant element including stripline resonators provided on a dielectric substrate, and to a method for manufacturing the resonant element.

2. Description of the Related Art

A resonant element including stripline resonators has been provided on a dielectric substrate to function as a filter or a balun (e.g., see Japanese Unexamined Patent Application Publication No. 2000-22404 and Japanese Unexamined Patent Application Publication No. 2004-147300).

The resonant elements disposed in Japanese Unexamined Patent Application Publication No. 2000-22404 and Japanese Unexamined Patent Application Publication No. 2004-147300 include a plurality of laminated dielectric substrate layers and principal-surface electrodes provided between the dielectric substrate layers. The resonant elements include a coupling adjusting electrode that faces a plurality of principal-surface electrodes via the dielectric substrate layers, so that the degree of coupling between the resonators is increased. In the configuration according to Japanese Unexamined Patent Application Publication No. 2000-22404, the respective dielectric substrate layers have the same permittivity, and almost the entire coupling degree is set by the capacitance between the coupling adjusting electrode and the principal-surface electrodes. On the other hand, in the configuration according to Japanese Unexamined Patent Application Publication No. 2004-147300, the plurality of laminated dielectric substrate layers have different permittivities, and the coupling degree is adjusted by adjusting the permittivities. Such resonant elements are manufactured by laminating a plurality of dielectric green sheets and an electrode paste a plurality of times and by sintering the laminate at one time. In each manufactured lot, a plurality of resonant elements are formed on a large laminate sheet and the respective resonant elements are obtained through dicing after sintering the laminate sheet.

The above-described sintering causes variations in shrinkage and composition of the respective dielectric green sheets and variations in quality in respective manufactured lots, so that not all of the resonant elements in the same manufactured lot satisfy a desired frequency characteristic. Particularly, in a resonant element including multistage resonators coupled to each other, variations in coupling degree among the resonators cause the frequency characteristic of the product to deviate from a necessary frequency characteristic. Accordingly, it has been required that variations in the frequency characteristic among manufactured lots be suppressed.

SUMMARY OF THE INVENTION

To overcome the problems described above, preferred embodiments of the present invention provide a resonant element manufacturing method capable of stabilizing quality and improving an acceptable item ratio in a manufacturing process and reducing variations in frequency characteristic among resonators, and provide a resonant element having a configuration suitable for the manufacturing method.

A method for manufacturing a resonant element according to a preferred embodiment of the present invention includes a setting step and a forming step in that order. The resonant element includes a substrate, a ground electrode, principal-surface electrodes, an electrode protecting layer, and a coupling adjusting electrode. Here, the substrate is made of a dielectric material. The ground electrode is formed on a rear principal surface side of the substrate. The principal-surface electrodes are formed on a front principal surface side of the substrate and define resonators together with the ground electrode and the dielectric material. The electrode protecting layer is formed on substantially the entire surface on the front principal surface side of the principal-surface electrodes and the substrate. The coupling adjusting electrode is formed on a front principal surface side of the electrode protecting layer and both ends thereof face the principal-surface electrodes of a plurality of the resonators.

In the setting step, the shape of the coupling adjusting electrode is set in each manufactured lot. In the forming step, the coupling adjusting electrode having the shape set in the setting step in each manufactured lot is formed on the front principal surface side of the substrate and the electrode protecting layer sintered in advance, and the coupling adjusting electrode is baked to the electrode protecting layer. Accordingly, in the stage of the setting step, the substrate provided with the ground electrode, the principal-surface electrodes, and the electrode protecting layer is used, and thus substantially all characteristic variables except a degree of coupling between the resonators have been set, whereby the shape of the coupling adjusting electrode can be appropriately set. Accordingly, variations in characteristic variables relative to design values can be calibrated, so that variations in frequency characteristic among manufactured lots can be reduced.

In the setting step, a predetermined characteristic of the resonators in each manufactured lot may be measured, and the formation size of the coupling adjusting electrode may be set based on the measurement result.

In the forming step, the coupling adjusting electrode may preferably be formed through a photolithography process, for example. In that case, exposure time or an opening shape of an exposure mask in the photolithography process is preferably set in each manufactured lot in the setting step.

When the electrode protecting layer has a permittivity that is less than the permittivity of the ceramic mother substrate, the sensitivity of the degree of coupling between resonators with respect to shape precision of the coupling adjusting electrode is less than that in the case where the electrode protecting layer has the same or substantially the same permittivity. Accordingly, the size of the coupling adjusting electrode may be relatively large, and variations in the shape precision do not cause a problem. Preferably, the electrode protecting layer should primarily include $SiO_2$ so that the permittivity thereof is less than that of a typical ceramic substrate.

According to various preferred embodiments of the present invention, a resonant element can be manufactured with reduced variations in degree of coupling between resonators, whereby an acceptable item ratio increases.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

The orthogonal coordinate system (X-Y-Z axes) shown in respective views indicates orientations of respective resonant elements.

First, an example of a resonant element defining a balun is described. The balun is a compact rectangular parallelepiped resonant element used in UWB (Ultra Wide Band) communication. The balun is defined by coupling two quarter-wavelength resonators with a half-wavelength resonator and by coupling the respective resonators with any of two balanced terminals or an unbalanced terminal.

Figure 1A:
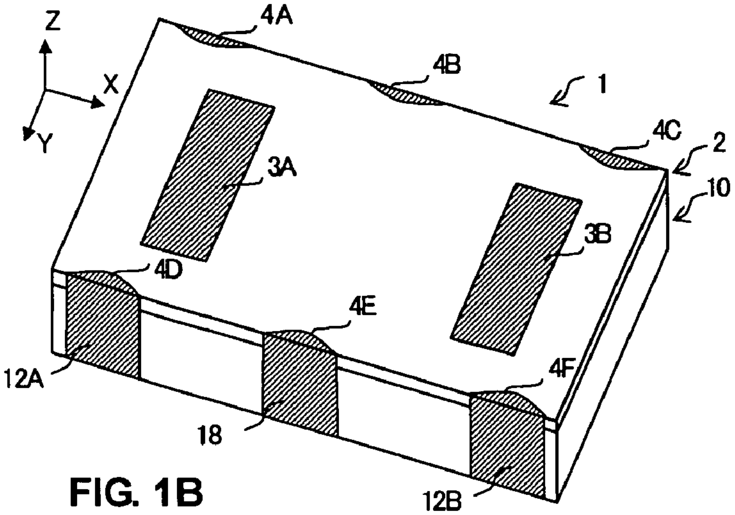
FIGS. 1A to 1C are perspective views illustrating a configuration example of a resonant element according to a preferred embodiment of the present invention.

FIG. 1A is a perspective view of a front principal surface side of the balun.

The balun 1 preferably has a configuration in which a thick glass layer 2 is laminated on a front principal surface side of a rectangular or substantially rectangular flat shaped substrate 10 made of a dielectric material. The substrate 10 preferably has a thickness (Z-axis dimension) of about 500 μm, whereas the thick glass layer 2 has a thickness (Z-axis dimension) of about 15 μm to about 30 μm, for example. Preferably, the X-axis dimension of the balun 1 is about 2.5 mm and the Y-axis dimension of the balun 1 is about 2.0 mm, for example.

In this example, the substrate 10 has a relative permittivity of about 110 and primarily includes a high-permittivity dielectric material of ceramic, such as titanium oxide, containing no $SiO_2$ or less than about 1 wt % of $SiO_2$. The composition of the substrate 10 is not limited to this example. The substrate 10 may include more than about 1 wt % of $SiO_2$ as long as it primarily includes a high-permittivity dielectric material and more than about 50 wt % of ceramic, for example.

On the other hand, the thick glass layer 2 in this example is a translucent insulator, has a relative permittivity of about 10, and includes a filler and glass.

The glass preferably includes more than about 50 wt % of $SiO_2$ and is capable of causing a glass transition phenomenon with $B_2O_3$ and $Bi_2O_3$ being added. If the softening temperature of the glass is too low, the shape of the thick glass layer 2 is not sufficiently maintained during firing of the thick glass layer 2, and thus, the glass should preferably include a predetermined amount or more of $SiO_2$. For example, when the maximum temperature during firing is about 850° C., the glass should preferably include more than about 55 wt % of $SiO_2$ so that the softening temperature does not become too low. If the softening temperature is too high, the thick glass layer 2 is not densely fired during firing of the thick glass layer 2, and thus, the glass should preferably include less than the predetermined amount of $SiO_2$. For example, when the maximum temperature during firing is about 850° C., the glass should preferably include less than about 75 wt % of $SiO_2$, for example, so that the softening temperature does not become too high.

The filler is a crystalline material that is resistant to softening during firing of the thick glass layer 2, such as quartz or aluminum, for example. The use of the filler suppresses the occurrence of shape flowage of the thick glass layer 2.

In this example, the above-described composition is used in the thick glass layer 2, whereby shape flowage of the thick glass layer 2 can be suppressed and the shape of electrodes formed on a front principal surface side of the thick glass layer 2 can be precisely set.

Extended electrodes 4A to 4F and coupling adjusting electrodes 3A and 3B are formed on a front principal surface of the balun 1, that is, on a front principal surface of the thick glass layer 2. The coupling adjusting electrodes 3A and 3B are rectangular or substantially rectangular silver electrodes that are arranged to face principal-surface electrodes of respective resonators and that preferably have a thickness (Z-axis dimension) of about 6 μm, for example. The extended electrodes 4A to 4F are electrodes formed due to extra electrode paste disposed on the principal surface during printing of side-surface electrodes. In some printing conditions, the extended electrodes 4A to 4F may not be formed.

The thick glass layer 2 can prevent the extended electrodes 4A to 4F from being short-circuited to unnecessary connection portions of the principal-surface electrodes during printing of the side-surface electrodes. Also, the thick glass layer 2 can prevent peeling of a circuit pattern on the substrate 10, thereby enhancing environment resistance. Furthermore, a light-shielding thick glass layer including an inorganic pigment (not illustrated) may be laminated on the front principal surface side of the balun 1 illustrated in FIG. 1A. If the light-shielding thick glass layer is provided, visibility for performing printing on the front surface of the balun 1 can be improved. Furthermore, the security of an inner circuit pattern can be protected.

Side-surface electrodes 11A, 11B, 12A, 12B, 12C, and 18 are formed on side surfaces of the balun 1. The side-surface electrodes 11A and 11B define ground terminals of the respective resonators. The side-surface electrodes 12A, 12B, and 12C connect the respective resonators to terminal electrodes (electrodes of balanced or unbalanced terminal). The side-surface electrode 18 is an electrode arranged to adjust a balanced-unbalanced characteristic. The respective side-surface electrodes are rectangular or substantially rectangular silver electrodes extending in the Z-axis direction from a rear principal surface of the substrate 10 toward the front principal surface of the thick glass layer 2. The respective side-surface electrodes preferably have a thickness (X-axis dimension) of about 15 μm, for example.

Figure 1B:
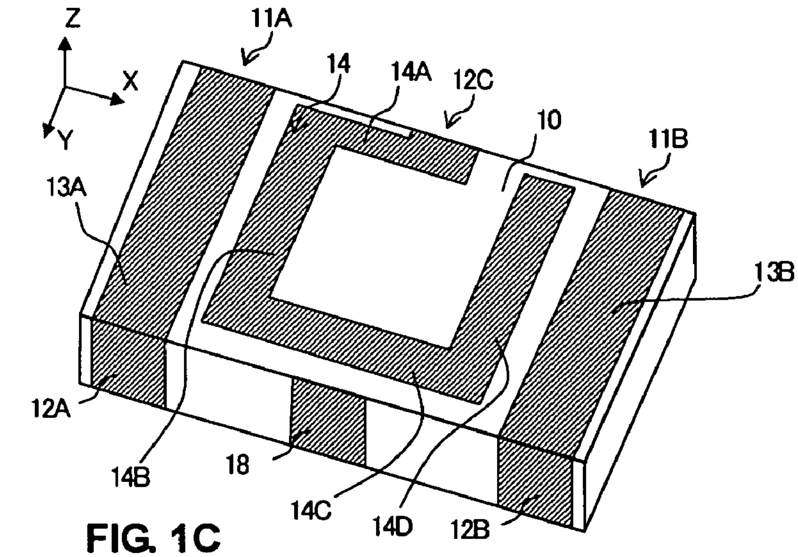

FIG. 1B is a perspective view of the front principal surface side of the balun 1 without the thick glass layer 2.

Principal-surface electrodes 13A, 13B, and 14 constituting three stages of stripline resonators are provided on a front principal surface of the substrate 10, between the substrate 10 and the thick glass layer 2. Preferably, the principal-surface electrodes 13A, 13B, and 14 are silver electrodes having a thickness (Z-axis dimension) of about 6 μm, for example.

The principal-surface electrodes 13A and 13B are I-shaped electrodes and define one-end-open and one-end-short-circuited quarter-wavelength resonators together with a ground electrode 15 and the side-surface electrodes 11A and 11B, respectively. The principal-surface electrodes 13A and 13B connect to the short-circuit side-surface electrodes 11A and 11B on the back side of the substrate 10, respectively, and are in conduction with the ground electrode 15 via the short-circuit side-surface electrodes 11A and 11B, respectively. Also, the principal-surface electrode 13A connects to the tap connecting lead electrode 12A on the front side and is in conduction with a terminal electrode 16A via the tap connecting lead electrode 12A. Likewise, the principal-surface electrode 13B connects to the tap connecting lead electrode 12B on the front side and is in conduction with a terminal electrode 16B via the tap connecting lead electrode 12B.

The principal-surface electrode 14 is preferably a substantially C-shaped electrode with an open back side and includes a line portion 14A extending from the approximate center of the back side to the left along the back side, a line portion 14B extending from the left end of the line portion 14A to the front side, a line portion 14C extending from the front end of the line portion 14B to the right, and a line portion 14D extending from the right end of the line portion 14C to the back side. The line portion 14B is parallel or substantially parallel to the principal-surface electrode 13A. The line portion 14D is parallel or substantially parallel to the principal-surface electrode 13B and is terminated at its end on the back side. The line portion 14A connects to the tap connecting lead electrode 12C provided at the approximate center on the back side and is in conduction with a terminal electrode 16C via the tap connecting lead electrode 12C.

Figure 1C:
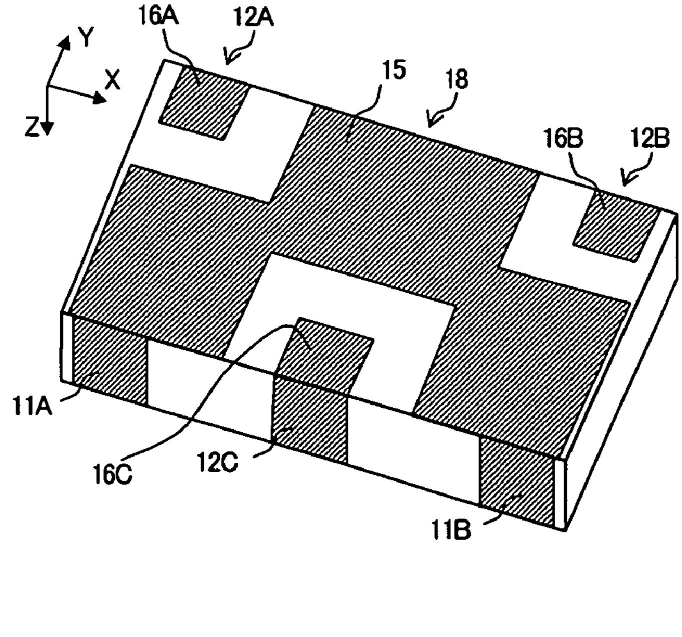

FIG. 1C is a perspective view of a rear principal surface side of the balun 1 without the thick glass layer 2. FIG. 1C illustrates the state in which the balun 1 illustrated in FIG. 1B has been turned around the X axis.

The ground electrode 15 and the terminal electrodes 16A, 16B, and 16C are provided on the rear principal surface of the substrate 10, that is, on the rear principal surface of the balun 1. The ground electrode 15 is a ground electrode of the stripline resonators and also functions as an electrode arranged to mount the balun 1 on a mount substrate. The terminal electrodes 16A, 16B, and 16C are connected to high-frequency signal input/output terminals when the balun 1 is mounted on the mount substrate. The terminal electrodes 16A and 16B define balanced terminals, whereas the terminal electrode 16C defines an unbalanced terminal. The ground electrode 15 is provided over substantially the entire rear principal surface of the substrate 10. The terminal electrodes 16A and 16B are arranged near corners contacting the side surface on the front side while being separated from the ground electrode 15. The terminal electrode 16C is arranged near a center portion contacting the side surface on the back side while being separated from the ground electrode 15. The ground electrode 15 and the terminal electrodes 16A, 16B, and 16C have a thickness (Z-axis dimension) of about 15 μm. Incidentally, an extra electrode paste is also disposed on the rear principal surface of the balun 1 during printing of the side-surface electrodes, but the extended electrodes on the rear principal surface are integrated with the ground electrode 15 and the terminal electrodes 16A, 16B, and 16C.

Hereinafter, a process of manufacturing the balun 1 is described.

Figure 2:
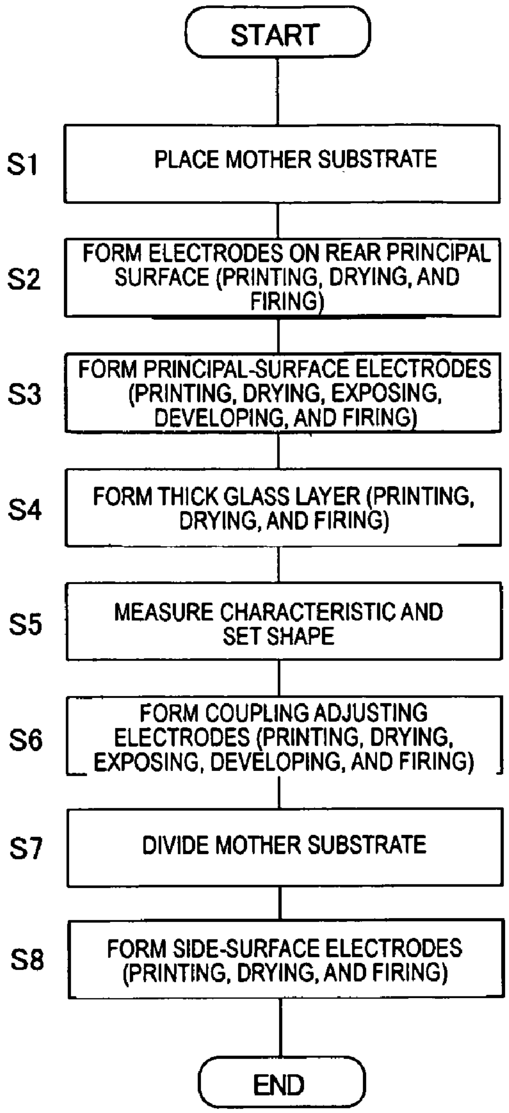
FIG. 2 is a flowchart illustrating a process of manufacturing the resonant element.

FIG. 2 is a flowchart illustrating the process of manufacturing the balun 1 in each manufactured lot.

(S1) First, a sintered large mother substrate having no electrode on any surface is prepared.

(S2) Then, screen printing is performed on a rear principal surface side of the mother substrate using an electrode paste, and a ground electrode and terminal electrodes are formed through drying and firing.

(S3) Then, printing is performed on a front principal surface side of the mother substrate using a photosensitive electrode paste, and respective principal-surface electrodes are formed through a photolithography process including drying, exposing, and developing, and firing.

(S4) Then, printing is performed on the front principal surface side of the mother substrate using a glass paste, and a thick glass layer is formed through drying and firing.

(S5) Then, a predetermined characteristic of the mother substrate is measured in a non-contact manner by an input/output loop for characteristic measurement. The characteristic to be measured may be any characteristic as long as a coupling degree can be measured or estimated. Then, the shape of the coupling adjusting electrodes is set so that a necessary design coupling degree can be obtained in the manufactured lot.

Alternatively, this step may be performed before the formation of the thick glass layer. In that case, the characteristic can be measured in a contact manner by connecting a measuring terminal to the principal-surface electrodes, for example.

(S6) Then, printing is performed on a front principal surface side of the thick glass layer using a photosensitive electrode paste, and the respective coupling adjusting electrodes are formed through a photolithography process including drying, exposing, and developing, and firing. During the step of exposing, the exposure time is adjusted and an exposure mask is selected so that the above-described set shape is produced.

(S7) Then, many element bodies are obtained by dicing from the mother substrate produced in the above-described manner. After the dicing, preliminary measurement of an electrical characteristic is performed on an upper-surface pattern of a portion of the element bodies.

(S8) Then, side-surface electrodes are printed on the side surfaces of the plurality of element bodies obtained through the dicing, and the respective side-surface electrodes are formed through drying and firing.

With this manufacturing method, coupling adjusting electrodes having an appropriate size are formed after the principal-surface electrodes have been formed on the front principal surface, so that a plurality of baluns 1 having a necessary coupling degree among resonators are manufactured.

Figure 3:
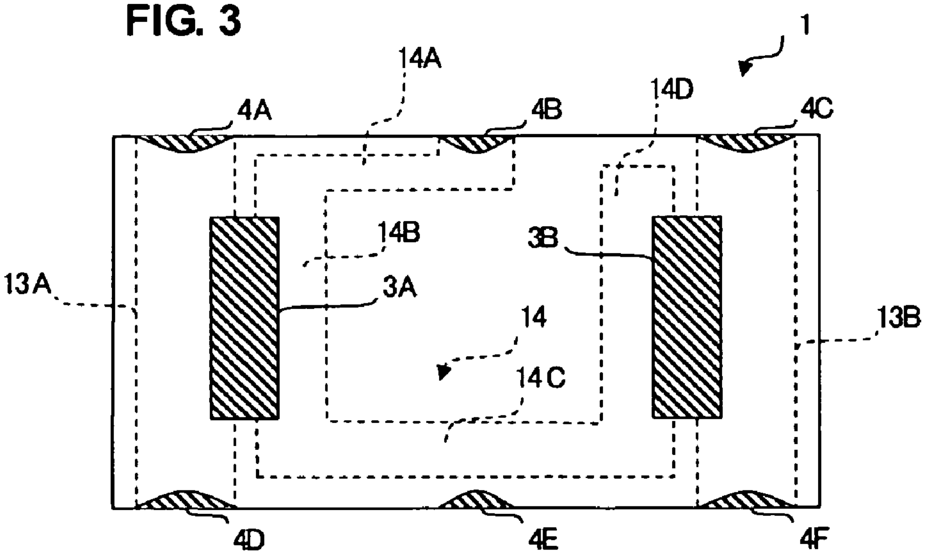
FIG. 3 is a developed view of the resonant element.

FIG. 3 is a plan view of the balun 1 obtained by the dicing, and the principal-surface electrodes disposed under the thick glass layer 2 are illustrated in a perspective manner.

The principal-surface electrode 13A is adjacent to the line portion 14B of the principal-surface electrode 14. Thus, a capacitance occurs between the principal-surface electrodes 13A and 14, and the capacitance causes electromagnetic coupling between the resonators. The capacitance between the principal-surface electrodes 13A and 14 is affected by the permittivity of the substrate 10. If the permittivity of the substrate 10 varies in respective manufactured lots, the capacitance significantly varies in respective manufactured lots.

The coupling adjusting electrode 3A partially faces the principal-surface electrode 13A and also partially faces the line portion 14B of the principal-surface electrode 14. Accordingly, a capacitance occurs between the coupling adjusting electrode 3A and the two facing principal-surface electrodes 13A and 14, and the coupling adjusting electrode 3A strengthens electromagnetic coupling between the two resonators. In the balun 1, the substrate 10 has a relative permittivity of about 110 and the thick glass layer 2 has a relative permittivity of about 10. The ratio of the relative permittivities is 11:1. Thus, the respective capacitances that occur between the coupling adjusting electrode 3A and the principal-surface electrode 13A and between the coupling adjusting electrode 3A and the principal-surface electrode 14 are much smaller than the capacitance that occurs between the principal-surface electrodes 13A and 14.

Therefore, in this configuration, variations in capacitance that occur between the principal-surface electrodes 13A and 14 can be absorbed and the degree of coupling between the two resonators can be calibrated by appropriately setting the shape of the coupling adjusting electrode 3A. For example, even when the area of the coupling adjusting electrode 3A is relatively large, the capacitance that is produced is relatively small because the relative permittivity of the thick glass layer 2 is extremely low, so that the coupling degree can be set very precisely by adjusting the area of the coupling adjusting electrode 3A. The above-described relationship is also established between the coupling adjusting electrode 3B and the principal-surface electrodes 13B and 14. The degree of coupling between the two resonators constituted by the principal-surface electrodes 13B and 14 can be calibrated by appropriately setting the shape of the coupling adjusting electrode 3B. Accordingly, a desired degree of coupling between the resonators can be obtained by performing shape adjustment when the coupling adjusting electrodes are formed in respective manufactured lots.

Furthermore, the degree of coupling between adjacent resonators can be precisely set by adjusting the shape of the coupling adjusting electrodes, thereby adjusting the facing area with respect to the respective principal-surface electrodes, deviation of the facing area between the coupling adjusting electrodes and the principal-surface electrodes, and the facing location of the coupling adjusting electrodes. Specifically, the degree of coupling between adjacent resonators is greater as the facing area between the coupling adjusting electrodes and the respective principal-surface electrodes increases and as the deviation of the facing area is decreased.

Next, a description of an example of a filter defined by a resonant element including five stages of resonators that mutually couple in an interdigital manner is provided. A main difference between this example and the above-described example is the shape and location of the electrodes. Other than the shape and location of the electrodes, the configuration is substantially the same.

Figure 4:
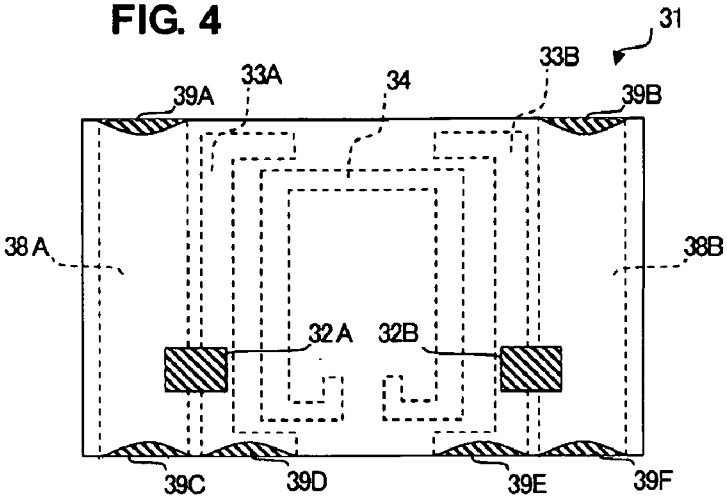
FIG. 4 is a developed view of a resonant element of according to another preferred embodiment of the present invention.

FIG. 4 is a plan view of a filter 31 and illustrates principal-surface electrodes disposed under the thick glass layer.

Principal-surface electrodes 38A, 33A, 34, 33B, and 38B defining five stages of stripline resonators are provided between the substrate and the thick glass layer. Extended electrodes 39A to 39F and coupling adjusting electrodes 32A and 32B are formed on a front principal surface of the filter 31. The coupling adjusting electrode 32A is a rectangular or substantially rectangular silver electrode arranged to face the principal-surface electrodes 38A and 33A. The coupling adjusting electrode 32B is a rectangular or substantially rectangular silver electrode arranged to face the principal-surface electrodes 38B and 33B. The extended electrodes 39A to 39F are electrodes formed by an extra electrode paste disposed on the principal surface during printing of side-surface electrodes.

The principal-surface electrodes 38A and 38B are substantially I-shaped electrodes and define lower-end-opened and upper-end-short-circuited quarter-wavelength resonators together with a ground electrode and side-surface electrodes, respectively. The principal-surface electrodes 33A and 33B are substantially C-shaped electrodes that are closed on the sides of the adjacent principal-surface electrodes 38A and 38B, respectively, and define upper-end-opened and lower-end-short-circuited quarter-wavelength resonators together with the ground electrode and side-surface electrodes, respectively. The principal-surface electrode 34 is a substantially C-shaped electrode having an open lower side, and defines a both-end-opened half-wavelength resonator. Accordingly, the resonators including the principal-surface electrodes 38A, 33A, 34, 33B, and 38B are mutually coupled in an interdigital manner.

Here, the principal-surface electrode 38A is adjacent to the principal-surface electrode 33A. Thus, capacitance occurs between the principal-surface electrodes 38A and 33A, and the capacitance causes electromagnetic coupling between the resonators. The capacitance between the principal-surface electrodes 38A and 33A is affected to the permittivity of the substrate. If the permittivity of the substrate varies in respective manufactured lots, the capacitance significantly varies in respective manufactured lots.

The coupling adjusting electrode 32A partially faces the principal-surface electrode 38A and also partially faces the principal-surface electrode 33A. Accordingly, capacitance occurs between the coupling adjusting electrode 32A and the two facing principal-surface electrodes 38A and 33A, and the coupling adjusting electrode 32A strengthens electromagnetic coupling between the two resonators.

Therefore, in the filter 31, variations in capacitance that occur between the principal-surface electrodes 38A and 33A can be absorbed and the degree of coupling between the two resonators can be calibrated by appropriately setting the shape of the coupling adjusting electrode 32A. This is substantially the same between the coupling adjusting electrode 32B and the principal-surface electrodes 38B and 33B. Accordingly, a desired degree of coupling between the resonators can be obtained by performing shape adjustment when the coupling adjusting electrodes are formed in respective manufactured lots.

Next, a description is provided of an example of a filter defined by a resonant element by using combline coupling of four stages of resonators. A primary difference between this example and the above-described example is the shape and location of electrodes. Other than that, the configuration is substantially the same.

Figure 5A:
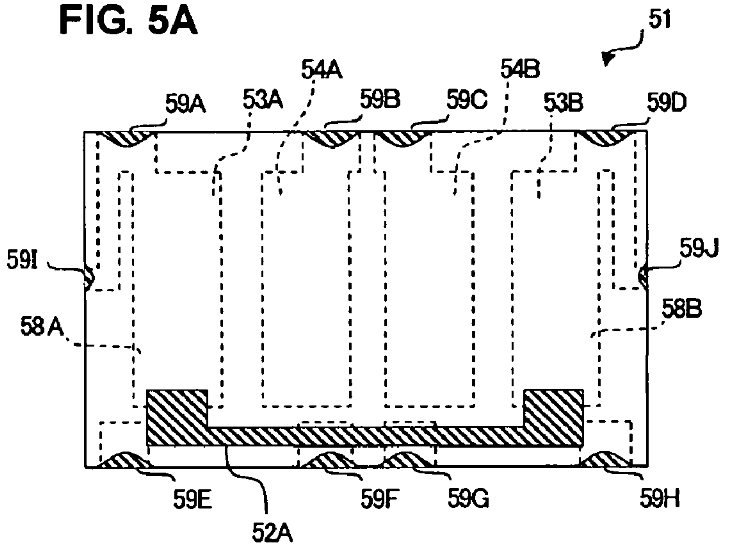
FIGS. 5A and 5B are developed views of a resonant element of according to another preferred embodiment of the present invention.

FIG. 5A is a plan view of a filter 51 and illustrates principal-surface electrodes disposed under the thick glass layer.

Principal-surface electrodes 53A, 54A, 54B, and 53B defining four stages of stripline resonators are provided between the substrate and the thick glass layer. Extended electrodes 59A to 59J and a coupling adjusting electrode 52A are formed on a front principal surface of the filter 51. The coupling adjusting electrode 52A is preferably a substantially C-shaped silver electrode that is opened on the lower side and that faces the principal-surface electrodes 53A and 53B. The extended electrodes 59A to 59J are electrodes formed by extra electrode paste disposed on the principal surface during printing of side-surface electrodes.

The principal-surface electrodes 53A, 54A, 54B, and 53B are substantially I-shaped electrodes and define lower-end-opened and upper-end-short-circuited quarter-wavelength resonators together with a ground electrode and side-surface electrodes, respectively. Accordingly, the resonators including the principal-surface electrodes 53A, 54A, 54B, and 53B that are mutually coupled in a combline manner.

The coupling adjusting electrode 52A partially faces the principal-surface electrode 53A and also partially faces the principal-surface electrode 53B. Accordingly, capacitance occurs between the coupling adjusting electrode 52A and the two facing principal-surface electrodes 53A and 53B, and the coupling adjusting electrode 52A strengthens electromagnetic coupling between the two resonators.

Therefore, in this filter 51, a desired degree of coupling between the resonators can be obtained by performing shape adjustment when the coupling adjusting electrode is formed in respective manufactured lots by appropriately setting the shape of the coupling adjusting electrode 52A.

Figure 5B:
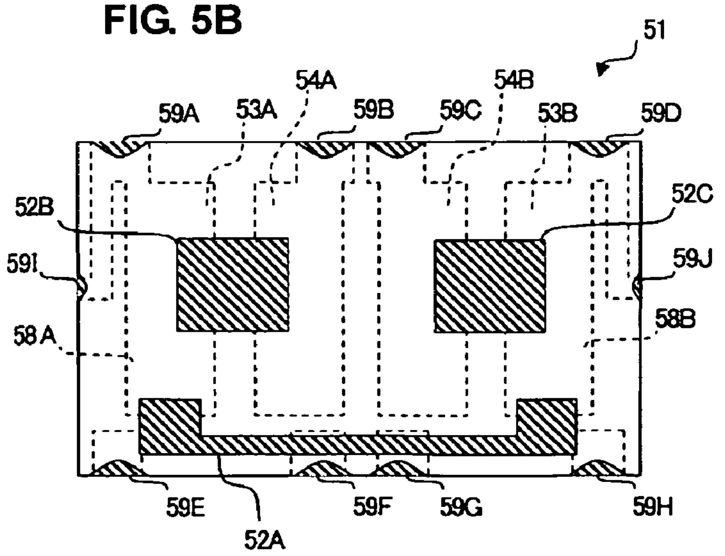

Alternatively, as illustrated in FIG. 5B, coupling adjusting electrodes 52B and 52C may be further provided on the front principal surface side of the filter 51. In this configuration, the coupling adjusting electrode 52B is arranged to face the principal-surface electrodes 53A and 54A, whereas the coupling adjusting electrode 52C is arranged to face the principal-surface electrodes 53B and 54B.

The coupling adjusting electrodes 52B and 52C partially face the principal-surface electrodes 53A and 53B, respectively, and also partially face the principal-surface electrodes 54A and 54B, respectively. Accordingly, capacitance occurs between the coupling adjusting electrodes 52B and 52C and the two facing principal-surface electrodes, and the coupling adjusting electrodes 52B and 52C strengthens electromagnetic coupling between the two resonators.

Therefore, by appropriately setting the shape of the coupling adjusting electrodes 52B and 52C, a desired degree of coupling between the resonators can be obtained by performing shape adjustment when the coupling adjusting electrodes are formed in respective manufactured lots.

Results obtained by examining an effect of the thick glass layer by simulation are shown.

Figure 6A:
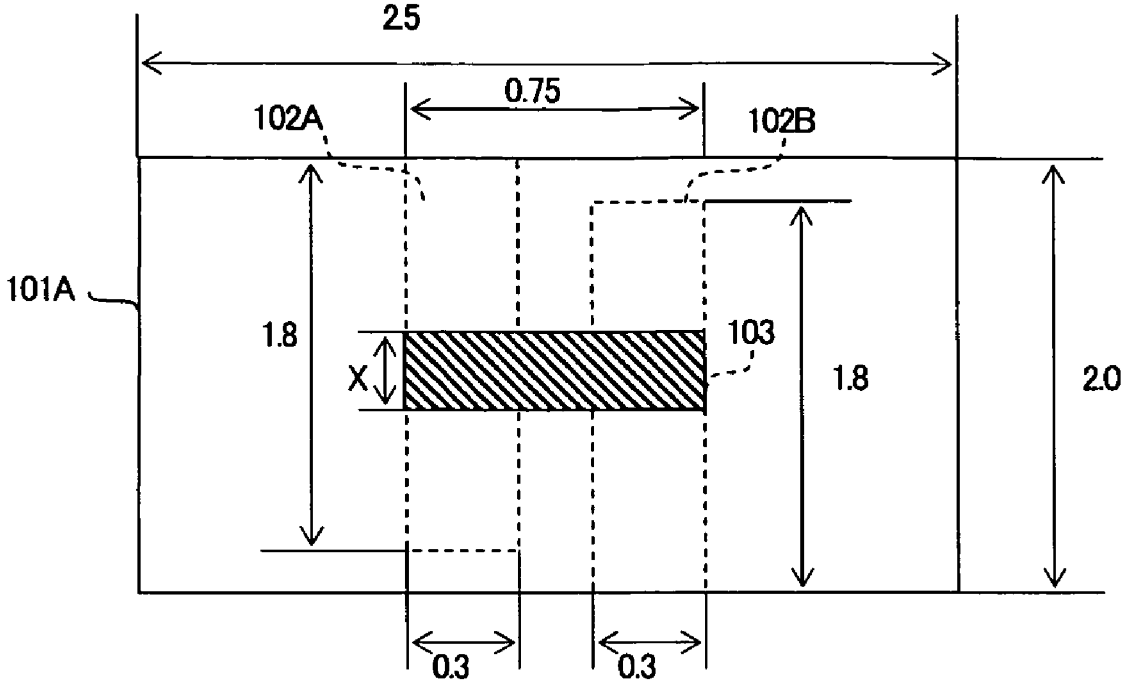
FIGS. 6A and 6B illustrate a simulation.
Figure 6B:
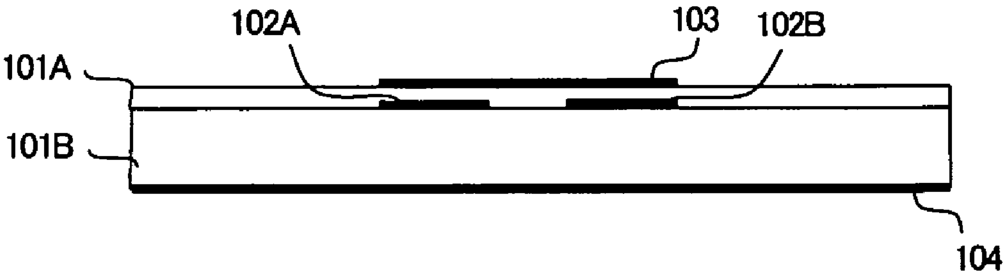

FIGS. 6A and 6B illustrate settings of the simulation.

Here, a thick film 101A is laminated on a ceramic substrate 101B. The ceramic substrate 101B and the thick film 101A preferably have a length of about 2.0 mm and a width of about 2.5 mm, for example. The ceramic substrate 101B preferably has a thickness of about 0.3 mm, whereas the thick film 101A has a thickness of about 20 μm, for example. A ground electrode 104 is formed on substantially an entire bottom surface of the ceramic substrate 101B. Principal-surface electrodes 102A and 102B are formed between the ceramic substrate 101B and the thick film 101A. A coupling adjusting electrode 103 is disposed on an upper surface of the thick film 101A. The principal-surface electrodes 102A and 102B preferably have a line length of about 1.8 mm and a line width of about 0.3 mm and are arranged with a gap of about 0.15 mm therebetween in the width direction, for example. The coupling adjusting electrode 103 preferably has a line length of about 0.75 mm and a variable line width of X mm, for example. The principal-surface electrodes 102A and 102B are short-circuited to the ground electrode 104 via side-surface electrodes (not illustrated) and define two resonators that are coupled in an interdigital manner. The coupling adjusting electrode 103 adjusts the degree of coupling between the two resonators.

As a result of simulating the degree of coupling between the two resonators under the condition in which the ceramic substrate 101B has a relative permittivity of about 110 and the thick film 101A has a relative permittivity of about 7, which is typical for glass primarily including $SiO_2$, the coupling degree (coupling coefficient) was about 34% when the coupling adjusting electrode 103 was not provided. On the other hand, when the coupling adjusting electrode 103 was provided by changing its line width X in the range of about 0.2 mm to about 0.6 mm, the coupling degree was about 40% to about 50%, which was increased by about 6% to about 16% as compared to the coupling degree of about 34%.

As can be understood from this result, it is preferable to set a design value of the degree of coupling between resonators to a relatively small value, examine a difference between an actual measurement value and the set value of the coupling degree in setting step S4 in the manufacturing process, and set the shape of coupling adjusting electrodes to calibrate the difference.

As a result of performing the simulation using the ceramic substrate having a relative permittivity of about 110 as the thick film 101A in a comparative example, the coupling degree (coupling coefficient) was about 40% when the coupling adjusting electrode 103 was not provided. On the other hand, when the coupling adjusting electrode 103 was provided by changing its line width X in the range of about 0.2 mm to about 0.6 mm, the coupling degree was about 68% to about 96%, which was increased by about 28% to about 56% as compared to the coupling degree of about 40%.

As can be understood from this result, it is difficult to precisely set the degree of coupling between resonators when the relative permittivity of the thick film 101A is as high as that of the ceramic substrate. For example, in the above-described comparative example where the relative permittivity of the thick film 101A is as high as that of the ceramic substrate, assume that the design value of coupling degree is about 50% and that allowable deviation is about 1%. In that case, the range of the line width X of the coupling adjusting electrode 103 is about 0.056 mm to about 0.071 mm in order to obtain a coupling degree of about 49% to about 51%. An allowable setting range of the line width X as the difference therebetween is about 0.015 mm, making it necessary to set the line width X very precisely, so that the adjustment is difficult.

On the other hand, in the example of a preferred embodiment of the present invention where the thick film 101A has a relative permittivity of about 7, the range of the line width X of the coupling adjusting electrode 103 is about 0.550 mm to about 0.720 mm in order to obtain a coupling degree of about 49% to about 51% when the design value of the coupling degree is about 50% and the allowable deviation is about 1%, for example. An allowable setting range of the line width X as the difference therebetween is about 0.170 mm, which permits some variations in the line width X, so that the adjustment is facilitated.

As can be understood from the above-described simulation results, the allowable setting range of the line width X can be increased and the coupling degree can be easily set within the designed range by applying the manufacturing method of preferred embodiments of the present invention. Therefore, according to preferred embodiments of the present invention, the degree of coupling between resonators can be adjusted with high precision.

The shape and location of the principal-surface electrodes and the coupling adjusting electrodes according to the above-described preferred embodiments are based on product specifications, and any shape may be used in accordance with product specifications. Preferred embodiments of the present invention can be applied to configurations other than the above-described configurations and can be used for various pattern shapes of resonant elements. Also, another configuration (e.g., high-frequency circuit) may be further provided in this resonant element.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method for manufacturing a resonant element including a substrate made of a dielectric material, a ground electrode formed on a rear principal surface side of the substrate, principal-surface electrodes formed on a front principal surface of the substrate and that define resonators together with the ground electrode and the dielectric material, an electrode protecting layer formed on substantially entire surfaces on a front principal surface side of the substrate and the principal-surface electrodes, and a coupling adjusting electrode that is formed on a front principal surface side of the electrode protecting layer and that has both ends facing the principal-surface electrodes of two of the resonators, the method comprising in order:

a setting step of setting a shape of the coupling adjusting electrode in each manufactured lot; and a forming step of forming the coupling adjusting electrode having the shape set in the setting step in each manufactured lot on the front principal surface side of the substrate and the electrode protecting layer sintered in advance, and baking the coupling adjusting electrode to the electrode protecting layer.

2. The method for manufacturing the resonant element according to claim 1, wherein the setting step is a step of measuring a predetermined characteristic of the resonators in each manufactured lot and setting a formation size of the coupling adjusting electrode based on a result of the measuring.

3. The method for manufacturing the resonant element according to claim 2, wherein the forming step is a step of forming the coupling adjusting electrode using a photolithography process, and the setting step is a step of setting an exposure time or an opening shape of an exposure mask in the photolithography process in each manufactured lot.

4. The method for manufacturing the resonant element according to claim 1, wherein the electrode protecting layer has a permittivity that is less than a permittivity of the substrate.

5. The method for manufacturing the resonant element according to claim 4, wherein the electrode protecting layer is a thick glass layer primarily including $SiO_2$.

* * * * *